United States Patent
Oguz et al.

(10) Patent No.: US 12,100,731 B2
(45) Date of Patent: Sep. 24, 2024

(54) CRYSTALLINE BOTTOM ELECTRODE FOR PEROVSKITE CAPACITORS AND METHODS OF FABRICATION

(71) Applicant: Intel Corporation, Santa Clara, CA (US)

(72) Inventors: Kaan Oguz, Portland, OR (US);
I-Cheng Tung, Hillsboro, OR (US);
Chia-Ching Lin, Portland, OR (US);
Sou-Chi Chang, Portland, OR (US);
Matthew Metz, Portland, OR (US);
Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 868 days.

(21) Appl. No.: 16/914,161

(22) Filed: Jun. 26, 2020

(65) Prior Publication Data
US 2021/0408224 A1 Dec. 30, 2021

(51) Int. Cl.
*H01L 27/06* (2006.01)
*H01L 49/02* (2006.01)

(52) U.S. Cl.
CPC .......... *H01L 28/65* (2013.01); *H01L 27/0629* (2013.01); *H01L 28/55* (2013.01)

(58) Field of Classification Search
CPC ....................................................... H01L 28/65
See application file for complete search history.

(56) References Cited

U.S. PATENT DOCUMENTS

| 5,892,254 | A | 4/1999 | Park et al. |
| 6,504,228 | B1 * | 1/2003 | Sone ........................ H01L 28/75 257/310 |
| 6,975,501 | B1 | 12/2005 | Baniecki et al. |
| 8,969,169 | B1 | 3/2015 | Chen et al. |

OTHER PUBLICATIONS

Extended European Search Report from European Patent Application No. 20209153.4 notified May 28, 2021, 6 pgs.
Office Action from Taiwanese Patent Application No. 109141649 notified May 3, 2024, 12 pgs.

* cited by examiner

*Primary Examiner* — William A Harriston
(74) *Attorney, Agent, or Firm* — Essential Patents Group, LLP

(57) ABSTRACT

A capacitor device, such as a metal insulator metal (MIM) capacitor includes a seed layer including tantalum, a first electrode on the seed layer, where the first electrode includes at least one of ruthenium or iridium and an insulator layer on the seed layer, where the insulator layer includes oxygen and one or more of Sr, Ba or Ti. In an exemplary embodiment, the insulator layer is a crystallized layer having a substantially smooth surface. A crystallized insulator layer having a substantially smooth surface facilitates low electrical leakage in the MIM capacitor. The capacitor device further includes a second electrode layer on the insulator layer, where the second electrode layer includes a second metal or a second metal alloy.

20 Claims, 13 Drawing Sheets

CRYSTALLINE BOTTOM ELECTRODE FOR PEROVSKITE CAPACITORS AND METHODS OF FABRICATION

BACKGROUND

Generally, Perovskite materials have a wide variety of applications in the modern electronic industry. Some examples of applications of Perovskite materials include usage in capacitors and transistors. Capacitors in integrated circuits can be utilized for creating memory devices or for circuit decoupling. Perovskite materials in conjunction with crystalline electrodes may be utilized for increasing the capacitance and reducing leakage current density in these applications. Therefore, there is a continuing need for improving capacitance density by utilizing materials that enable higher dielectric response while minimizing leakage current.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
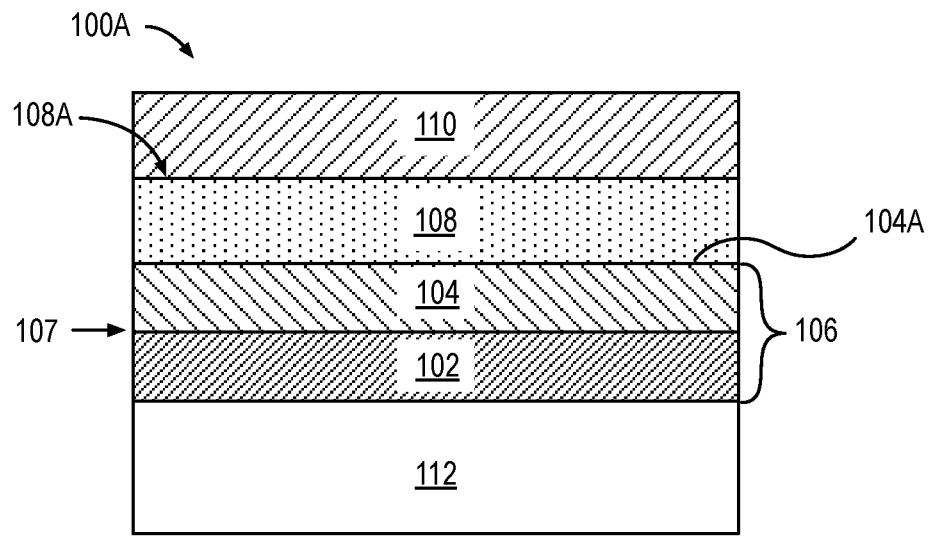
FIG. 1A illustrates a cross-sectional view of a capacitor including a crystallization layer and a Perovskite dielectric material, in accordance with an embodiment of the present disclosure.

Various capacitor devices with a crystallization layer, one or more electrode layers on/above the crystallization layer and an insulator layer on the crystallization layer are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with capacitors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

A metal-insulator-metal (MIM) capacitor can be utilized in a variety of applications such as for decoupling capacitance in high power microprocessor units, in radio frequency circuits and in other analog integrated circuit devices. A decoupling capacitor, for example, provides a bypass path for transient currents in the circuit. Transient currents can ordinarily damage active electronic devices such as transistors. A decoupling capacitor can also provide power to an integrated circuit and keep the power supply voltage stable. The decoupling capacitor does this by absorbing excess electrical energy (charge) flowing through the circuit. It is desirable for a decoupling capacitor to have a sufficiently large capacitance, such as a capacitance above 8 microfarads/cm$^2$, to control the excess electrical energy and provide a stable power supply voltage. A large capacitance can be obtained when an insulator in a MIM capacitor has a high dielectric constant. A dielectric constant above 20 may be considered to be high. Typical dielectric constants of known dielectric materials such as oxides of hafnium, aluminum or zirconium are in the range of 25-35. Capacitance of MIM capacitors that utilize one or more traditional dielectric materials can be increased by reducing the thickness of the one or more dielectric materials.

By implementing a material with a dielectric strength that is substantially greater than 50, the capacitance of a MIM capacitor can be increased without reducing the thickness of the dielectric material. Increasing the capacitance enables the MIM capacitor to absorb a greater amount of energy during a transient discharge, for example. One class of materials which has a high dielectric constant is Perovskite oxides. Perovskites have a dielectric permittivity (related to the dielectric constant) that is dependent on temperature of the material. The peak dielectric permittivity is near a Curie temperature of the material. Materials such as $BaTiO_3$, $SrTiO_3$, $BaSrTiO_3$ are some examples of Perovskites that have dielectric constants that are substantially greater than oxides of metals such as hafnium or zirconium. But to fully utilize a high dielectric constant property of a Perovskite, it is important for the Perovskite insulator to be crystalline and stable at high temperatures.

Though a high dielectric strength material between two electrodes of a MIM capacitor can increase capacitance, a MIM capacitor may nevertheless degrade due to charge leakage. Charge leakage (or leakage current) can be a limiting factor for a MIM capacitor because charge leakage leads to energy loss. There are several factors that can affect charge leakage. Poor crystallinity in a Perovskite insulator can lead to charge leakage. For example, any nanoscopic variations in the insulator such as presence of pinholes defects can alter the electric field characteristics within a capacitor area and affect the dielectric strength of the insulator.

Leakage current may inherently be tied to the surface morphology of the metal electrodes directly adjacent to the insulator in a MIM capacitor, as well as to interfaces between the metal electrodes and the insulator. Surface roughness of metal electrodes can increase surface potential across the insulator and consequently the average electric fields inside the insulator. An increase in the average electric fields inside the insulator can alter the leakage current within the insulator. In some conditions, leakage current density is exponentially related to a strength of the electric field. A higher electric field strength inside the insulator can lead to an increase in leakage current density.

Thus, to reduce leakage current density it is desirable to reduce the surface roughness of the electrodes. Electrode materials including ruthenium or iridium may be lattice matched with a perovskite insulator such as one including oxygen and one or more of barium or strontium. However, surface quality of a ruthenium or an iridium electrode can be poor. Surface morphological analysis of ruthenium or iridium formed on silicon oxide or crystalline silicon substrates show surface RMS variation of at least 15 nm when the ruthenium or iridium is deposited at high temperature (such as temperatures greater than 400C). Furthermore, such electrodes also suffer from large surface discontinuities.

The inventors have found that by forming a ruthenium or iridium electrode directly on a seed layer including tantalum, morphological problems described above can be mitigated. Some advantageous embodiments of a tantalum seed layer include a cubic crystal structure which provides nucleation sites for ruthenium or iridium crystals. Ruthenium or iridium electrodes formed on a tantalum seed layer may have surface roughness that are at least an order of magnitude less than those electrodes not formed on a tantalum seed layer. In embodiments, the seed layer having a thickness between 1 nm and 10 nm is sufficient for nucleating ruthenium or iridium electrode with an RMS surface roughness of less than or equal to 1.2 nm. Such an arrangement of an electrode on a seed layer may be referred to as an electrode structure.

The inventors have further found that a perovskite insulator including oxygen, and one or more of barium or strontium formed on the electrode structure described above has a highly desirable polycrystalline property. MIM capacitors including the electrode structure, a Perovskite insulator layer on the electrode structure and a top electrode on the Perovskite insulator layer has reduced leakage current density in the range of $10^{-6}$ to $10^{-3}$ $A/cm^2$. A leakage current density in the range of $10^{-6}$ to $10^{-3}$ $A/cm^2$ may be considered to be advantageous for a variety of applications.

A capacitor device, such as a metal insulator metal (MIM) capacitor includes a seed layer including tantalum, a first electrode on the seed layer, where the first electrode includes at least one of ruthenium or iridium and an insulator layer on the seed layer, where the insulator layer includes oxygen and one or more of Sr, Ba or Ti. In an exemplary embodiment, the insulator layer is a crystallized layer having a substantially smooth surface. A crystallized insulator layer having a substantially smooth surface facilitates low electrical leakage in the MIM capacitor. The capacitor device further includes a second electrode layer on the insulator layer, where the second electrode layer includes a second metal or a second metal alloy.

In an embodiment, the first electrode includes a single layer of a metal such as ruthenium or iridium. In other embodiments, the first electrode includes a dual layer stack, where the first layer is ruthenium and the second layer is iridium or vice versa. Such a dual layer stack may enable improved lattice matching between the electrode and the insulator layer.

In an embodiment, the capacitor is a planar MIM capacitor. In other embodiments, the capacitor is trench capacitor, where the seed layer is adjacent to a sidewall and on a base of a via, and where the first electrode layer is conformal with the seed layer, where the insulator layer is conformal with the first electrode layer and further where the second electrode layer is conformal with the insulator layer.

FIG. 1A is an illustration of a cross-sectional view of a capacitor 100A (herein MIM capacitor 100A) in accordance with an embodiment of the present disclosure. As shown the capacitor device 100A includes a seed layer 102, where the seed layer 102 includes a crystalline tantalum and a first electrode 104 on the seed layer 102, where the electrode 104 includes at least one of ruthenium or iridium. The seed layer 102 and the electrode 104 may be collectively referred to an electrode structure 106. In an embodiment, the tantalum seed layer 102 has an amorphous structure. A tantalum seed layer 102 is advantageously chosen for its high melting point, such as greater than 1500 degrees C. A further advantage includes ease of patterning a seed layer 102 including tantalum compared to other refractory metals, such as titanium or tungsten, that have similar melting points. The MIM capacitor 100A includes an insulator layer 108 on the seed layer 102, where the insulator layer 108 includes oxygen and one or more of Sr, Ba or Ti. The MIM capacitor 100A further includes a second electrode 110 on the insulator layer 108, where the electrode 110 includes a second metal or a metal alloy.

In an exemplary embodiment, the ruthenium electrode 104 has a highly desirable hexagonal phase, when part of an electrode structure 104. The hexagonal phase is advantageous because it has sufficiently low root mean square (RMS) thickness variation of the top surface 104A. An RMS thickness variation of top surface 104A of less than 1.5 nm is considered sufficiently low. The thickness variation of the top surface 104A may depend on the thickness of the seed layer 102 and on the ruthenium electrode 104. In embodiments, the seed layer 102 has a thickness that is between 1 nm and 10 nm. In embodiments, the ruthenium electrode 104 has a thickness between 10 nm and 20 nm. In an exemplary embodiment, the surface 104A has a thickness variation of 1.2 nm for a seed layer 102 having a thickness of at least 1 nm and a ruthenium electrode 104 having a thickness of at least 10 nm. In some such embodiments, the seed layer 102 includes tantalum. It can be appreciated that grain boundaries within a ruthenium electrode 104 and interface 107 between the ruthenium electrode 104 and the seed layer 102 may include oxygen from the adjacent insulator layer 108.

In other embodiments, the electrode 104 includes iridium. Iridium forms face centered cubic crystal structure on seed layer 102 with lattice matching to insulator layer 108. In some such embodiments a level of oxygen at the interface 107 may be substantially lower than for an electrode structure 106 that includes an electrode 104 having iridium instead of ruthenium. However, an iridium electrode 104 having a thickness of at least 10 nm has a greater RMS thickness variation than a ruthenium electrode 104 having the same thickness.

Lattice matching between the insulator layer 108 and the electrode 104 depends on the respective material composition of each layer. In some embodiments, the insulator layer 108 comprises oxygen, strontium and titanium. In an embodiment, the relative ratio of the atoms with respect to each other corresponds to that which would be present in a solid solution of $SrTiO_3$. In an embodiment, a $SrTiO_3$ insulator layer 108 includes a crystallized material layer having a substantially smooth uppermost surface 108A. However, an RMS thickness variation of the uppermost surface 108A is dependent on whether the electrode 104 includes iridium or ruthenium. A $SrTiO_3$ insulator layer 108 has a higher degree of lattice matching with an electrode 104 that includes iridium than an electrode 104 that includes ruthenium. In an embodiment, an uppermost surface 108A of a $SrTiO_3$ insulator layer 108 has a RMS thickness variation that is between 0.3 nm and 1.5 nm.

In other embodiments, the insulator layer 108 comprises oxygen, barium and titanium. In some such embodiments, the relative ratio of the atoms with respect to each other corresponds to that which would be present in a solid solution of $BaTiO_3$. A $BaTiO_3$ insulator layer 108 has a higher degree of lattice matching with an electrode 104 that includes iridium than an electrode 104 that includes ruthenium. In an embodiment, an uppermost surface 108A of a $BaTiO_3$ insulator layer 108 has a RMS thickness variation that is between 0.3 nm and 1.5 nm.

In yet another embodiment, the insulator layer 108 comprises oxygen, Sr, Ba and Ti. In some such embodiments, the relative ratio of the atoms with respect to each other corresponds to that which would be present in a solid solution of $Ba_xSr_{1-x}TiO_3$, wherein X is less than 95 and greater than 5. A $Ba_xSr_{1-x}TiO_3$ insulator layer 108 has a higher degree of lattice matching with an electrode 104 that includes iridium than an electrode 104 that includes ruthenium. In an embodiment, an uppermost surface 108A of a $Ba_xSr_{1-x}TiO_3$ insulator layer 108 has a RMS thickness variation that is between 0.3 nm and 1.5 nm.

A crystallized insulator layer 108 having a RMS thickness variation between 0.3 nm and 1.5 nm on the uppermost surface 104A having an RMS thickness variation between 0.3 nm and 1.5 nm enables the MIM capacitor 100A to operate with low electrical leakage. In embodiments, the electrical leakage is between $10^{-6}$ to $10^{-3}$ A/cm$^2$.

In the illustrative embodiment, the seed layer 102 is on a substrate 112. In embodiments, substrate 112 includes silicon, silicon germanium, germanium, or a silicon on insulator (SOI) substrate.

Figure 1B:
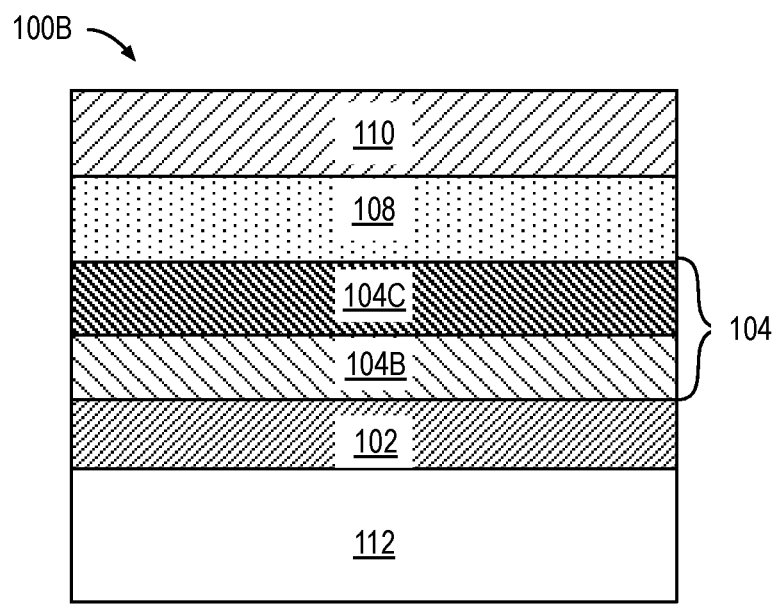
FIG. 1B illustrates a cross-sectional view of a capacitor including a plurality of crystallization layers and a Perovskite dielectric material, in accordance with an embodiment of the present disclosure.

In an embodiment, the electrode 104 includes a multilayer stack to fully utilize advantages of the various materials described above. FIG. 1B is a cross-sectional illustration of a MIM capacitor 100B that includes an electrode 104 having a multilayer stack between the insulator layer 108 and the seed layer 102. Such a multilayer stack can advantageously balance lattice matching between electrode layer 104 and beneficial crystal nucleation of between the seed layer and electrode layer 104 and lowering oxygen diffusion. This structure can enhance crystallization of insulator layer 108.

In the illustrative embodiment, the electrode 104 has a first electrode layer 104B including one of iridium or ruthenium and a second electrode layer 104C on the first electrode layer 104B, where the second electrode layer 104 includes the other of ruthenium or iridium. In an exemplary embodiment, first electrode layer 104B includes ruthenium and the second electrode layer 104C includes iridium. In some such embodiments, the iridium electrode layer 104C is highly lattice matched with the insulator layer 108 and the ruthenium electrode layer 104B benefits from a crystal nucleation with a tantalum seed layer 102.

The MIM capacitors 100A and 100B can operate with reduced electrical field gradients through the insulator layer 108 and thus minimize leakage current for an insulator layer 108 that is crystalline. The extent of crystallization of the material in the insulator layer 108 depends on the electrode 104 and on the tantalum seed layer 102. The extent of crystallization of the material in the insulator layer 108 is given by an X-Ray Diffraction (XRD) plot.

Figure 2A:
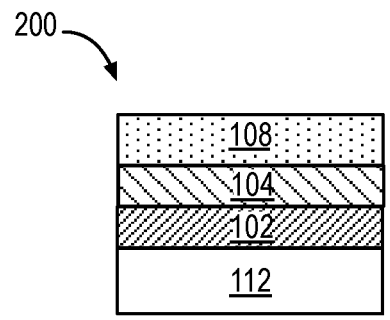
FIG. 2A illustrates a cross-sectional view of a material layer stack including an electrode, a crystallization layer and a perovskite dielectric material.
Figure 2B:
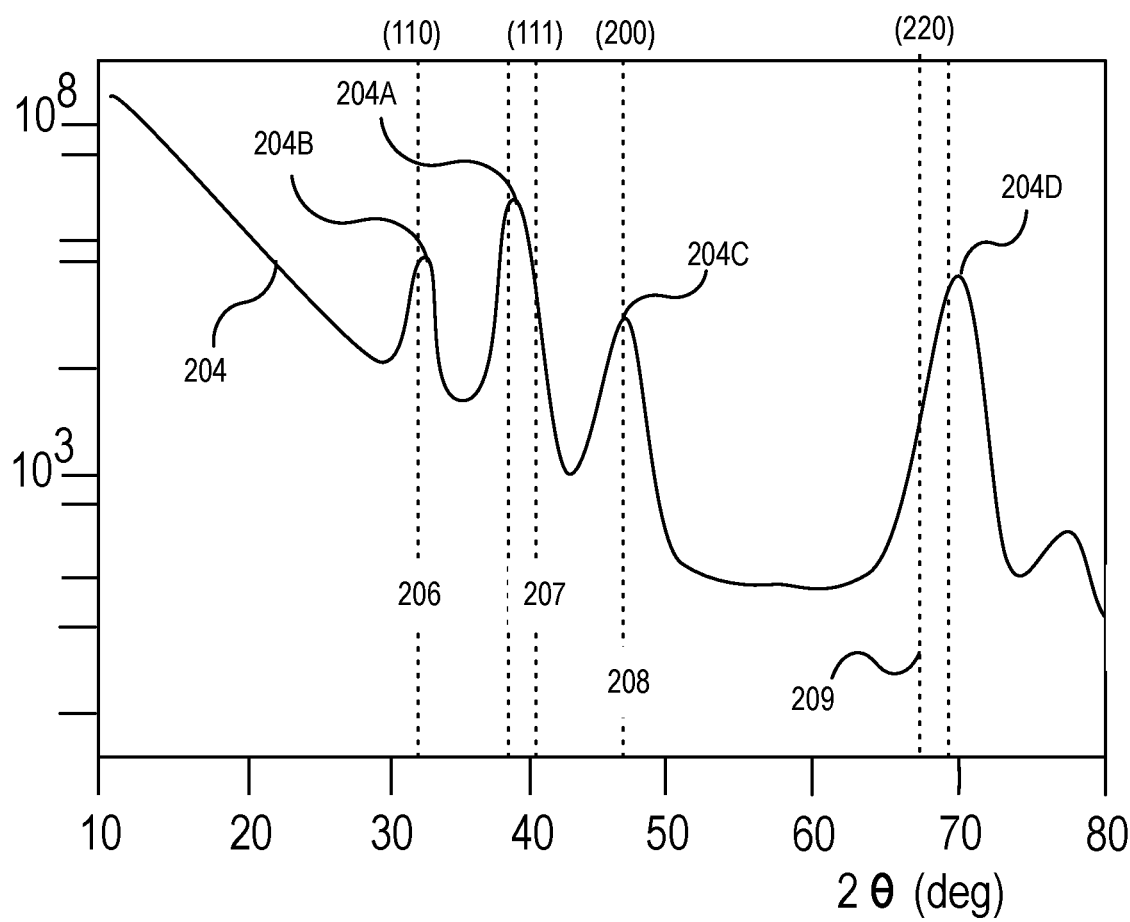
FIG. 2B is a plot of a X-ray diffraction pattern for a material layer stack illustrated in FIG. 2A.

FIG. 2A is a cross-sectional illustration of a stack 200 that includes a Ta-seed layer 102, an electrode 104 including ruthenium on the Ta-seed layer 102, and an insulator layer 108 including strontium titanate ($SrTiO_3$) on the ruthenium electrode 104, in accordance with an embodiment of the present disclosure. In the illustrative embodiment, the seed layer 102 is on a silicon substrate 112. In an embodiment, the insulator layer 108 is deposited at a temperature of 400 degrees Celsius. A plot 204 of an X-ray diffraction of stack 200 is illustrated in FIG. 2B. The plot 204 is a plot of an x-ray intensity peak (in arbitrary units) versus diffraction angle (2 theta) for the stack 200.

The plot 204 illustrates a presence of four distinct peaks 204A, 204B 204C and 204D in plot 204. The presence of peaks 204A, 204B 204C and 204D is indicative of crystallinity in the insulator layer 108. The presence of peaks 204A, 204B 204C and 204D in plot 204 is indicative that a high temperature process utilized to deposit insulator layer 108, forms a tantalum-seed layer 102 that promotes formation of a hexagonal ruthenium electrode 104. The crystalline peaks 204A, 204B 204C and 204D further indicate that the hexagonal ruthenium electrode 104 promotes formation of a polycrystalline insulator layer 108. Dashed lines 206, 207, 208 and 209 refer to 4 distinct crystal planes in the $SrTiO_3$ insulator layer 108. In the plot, dashed line 206 corresponds to a $SrTiO_3$ (110) crystal plane, dashed line 207 corresponds to a $SrTiO_3$ (111) crystal plane, dashed line 208 corresponds to a $SrTiO_3$ (200) crystal plane and dashed line 209 corresponds to a $SrTiO_3$ (220) crystal plane. Peaks 204A and 204D have shoulders indicating presence of (111) and (220) $SrTiO_3$ peaks.

Figure 3A:
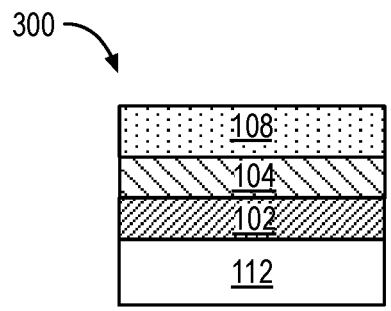
FIG. 3A illustrates a cross-sectional view of a material layer stack including an electrode, a crystallization layer and a perovskite dielectric material.
Figure 3B:
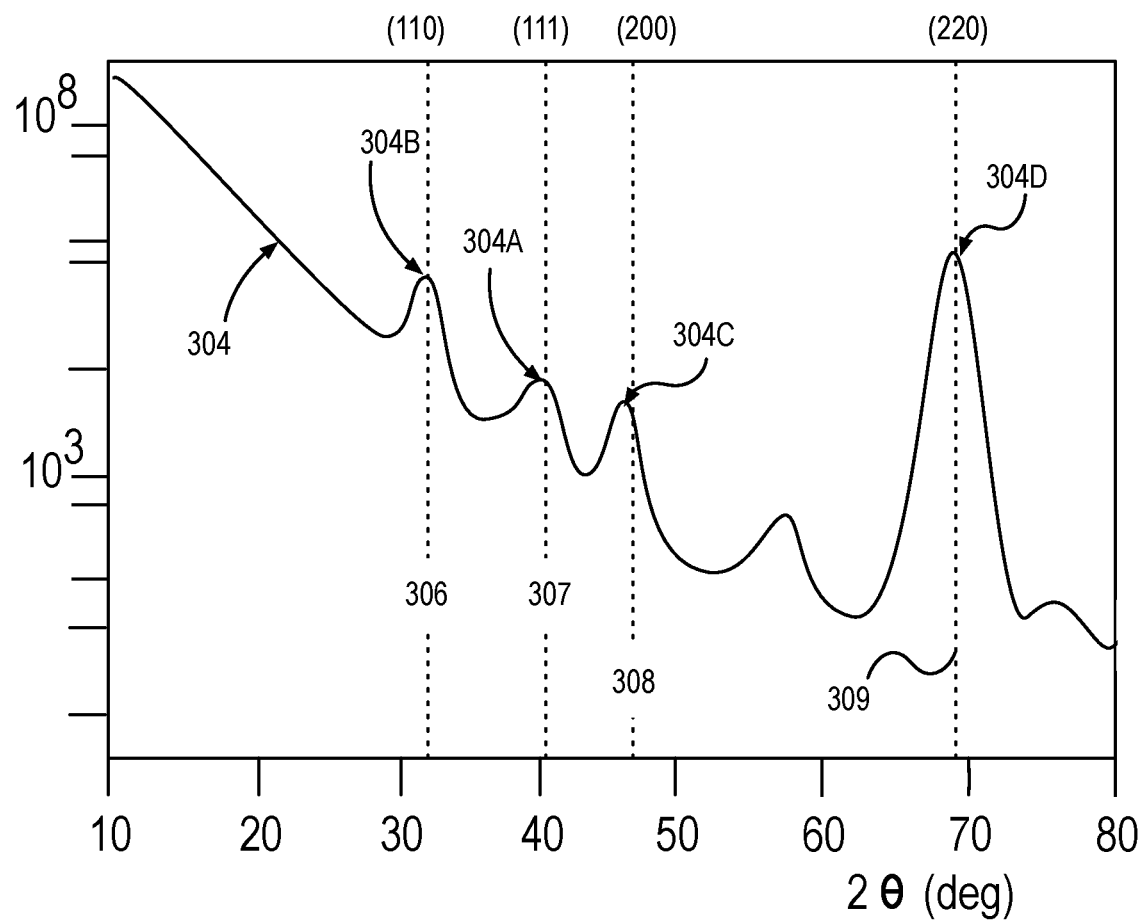
FIG. 3B is a plot of a X-ray diffraction pattern for a material layer stack illustrated in FIG. 3A.

FIG. 3A is a cross-sectional illustration of a stack 300 that includes a Ta-seed layer 102, an electrode 104 including iridium on the Ta-seed layer 102, and an insulator layer 108 including strontium titanate (SrTiO₃) on the iridium electrode 104, in accordance with an embodiment of the present disclosure. In the illustrative embodiment, the seed layer 102 is on a silicon substrate 112. In an embodiment, the insulator layer 108 is deposited at a temperature of 400 degrees Celsius. A plot 304 of an X-ray diffraction of stack 300 is illustrated in FIG. 3B. The plot 304 is a plot of an x-ray intensity peak (in arbitrary units) versus diffraction angle (2 theta) for the stack 300.

The plot 304 illustrates a presence of four distinct peaks 304A, 304B, 304C and 304D in plot 304. The presence of peaks 304A, 304B, 304C and 304D is indicative of crystallinity in the insulator layer 108. The presence of peaks 304A, 304B, 304C and 304D in plot 304 is indicative that a high temperature process utilized to deposit insulator layer 108, forms a tantalum-seed layer 102 that promotes formation of a polycrystalline cubic iridium electrode 104. The crystalline peaks 304A, 304B, 304C and 304D further indicate that the cubic iridium electrode 104 promotes formation of a polycrystalline insulator layer 108. Dashed lines 306, 307, 308 and 309 refer to 4 distinct crystal planes in the SrTiO₃ insulator layer 108. In the plot, dashed line 306 corresponds to a SrTiO₃ (110) crystal plane, dashed line 307 corresponds to a SrTiO₃ (111) crystal plane, dashed line 308 corresponds to a SrTiO₃ (200) crystal plane and dashed line 309 corresponds to a SrTiO₃ (220) crystal plane. Peaks 304A and 304D have shoulders indicating presence of (111) and (220) SrTiO₃ peaks.

Figure 4A:
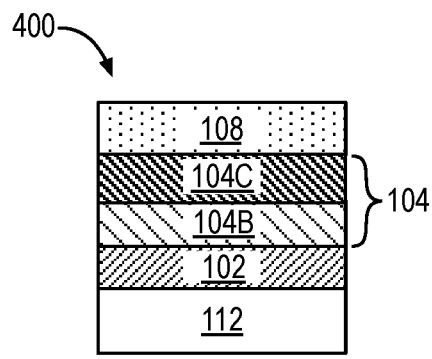
FIG. 4A illustrates a cross-sectional view of a material layer stack including an electrode, a crystallization layer and a perovskite dielectric material.
Figure 4B:
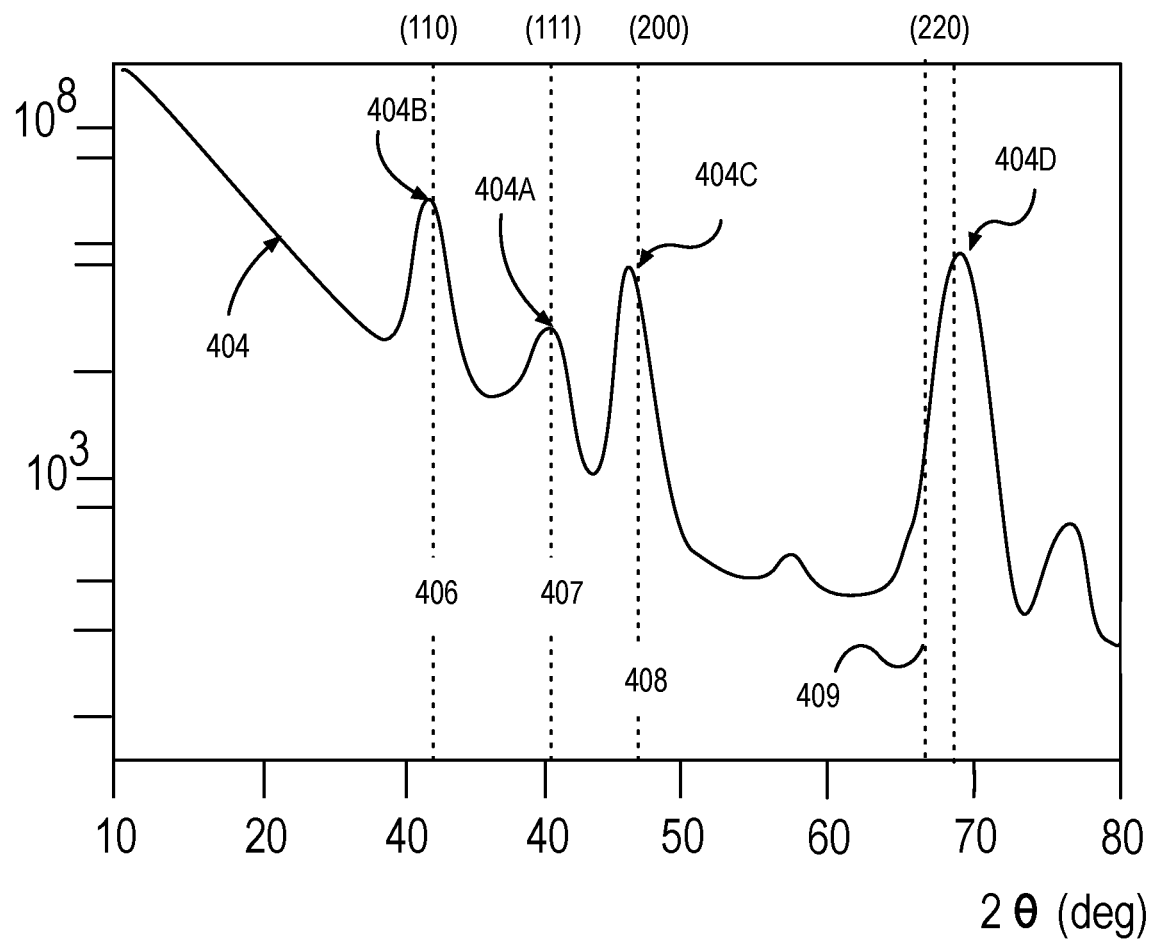
FIG. 4B is a plot of a X-ray diffraction pattern for a material layer stack illustrated in FIG. 4A.

FIG. 4A is a cross-sectional illustration of a stack 400 that includes a Ta-seed layer 102, a bilayer electrode 104 on the Ta-seed layer 102, and an insulator layer 108 including strontium titanate (SrTiO₃) on the bilayer electrode 104, in accordance with an embodiment of the present disclosure. In the illustrative embodiment, the bilayer electrode 104 includes an electrode layer 104B including ruthenium on an electrode layer 104A including iridium. In the illustrative embodiment, the seed layer 102 is on a silicon substrate 112. In the illustrative embodiment, the bilayer electrode 104 includes a lower electrode 104A including Ru, and an upper electrode 104B including Ir on the lower electrode 104A. In an embodiment, the insulator layer 108 is deposited at a temperature of 400 degrees Celsius. A plot 404 of an X-ray diffraction of stack 400 is illustrated in FIG. 3B. The plot 404 is a plot of an x-ray intensity peak (in arbitrary units) versus diffraction angle (2 theta) for the stack 400.

The plot 404 illustrates a presence of four distinct peaks 404A, 404B, 404C and 404D in line 404. The presence of peaks 404A, 404B, 404C and 404D is indicative of crystallinity in the insulator layer 108. The presence of peaks 404A, 404B, 404C and 404D in plot 404 is indicative that a high temperature process utilized to deposit insulator layer 108, forms a tantalum-seed layer 102 that promotes formation of a cubic iridium electrode 104. The crystalline peaks 404A, 404B, 404C and 404D further indicate that the cubic iridium electrode 104 promotes formation of a polycrystalline insulator layer 108. Dashed lines 406, 407, 408 and 409 refer to 4 distinct crystal planes in the SrTiO₃ insulator layer 108. In the plot, dashed line 406 corresponds to a SrTiO₃ (110) crystal plane, dashed line 407 corresponds to a SrTiO₃ (111) crystal plane, dashed line 408 corresponds to a SrTiO₃ (200) crystal plane and dashed line 409 corresponds to a SrTiO₃ (220) crystal plane. Peaks 404A and 404D have shoulders indicating presence of (111) and (220) SrTiO₃ peaks.

Figure 5:
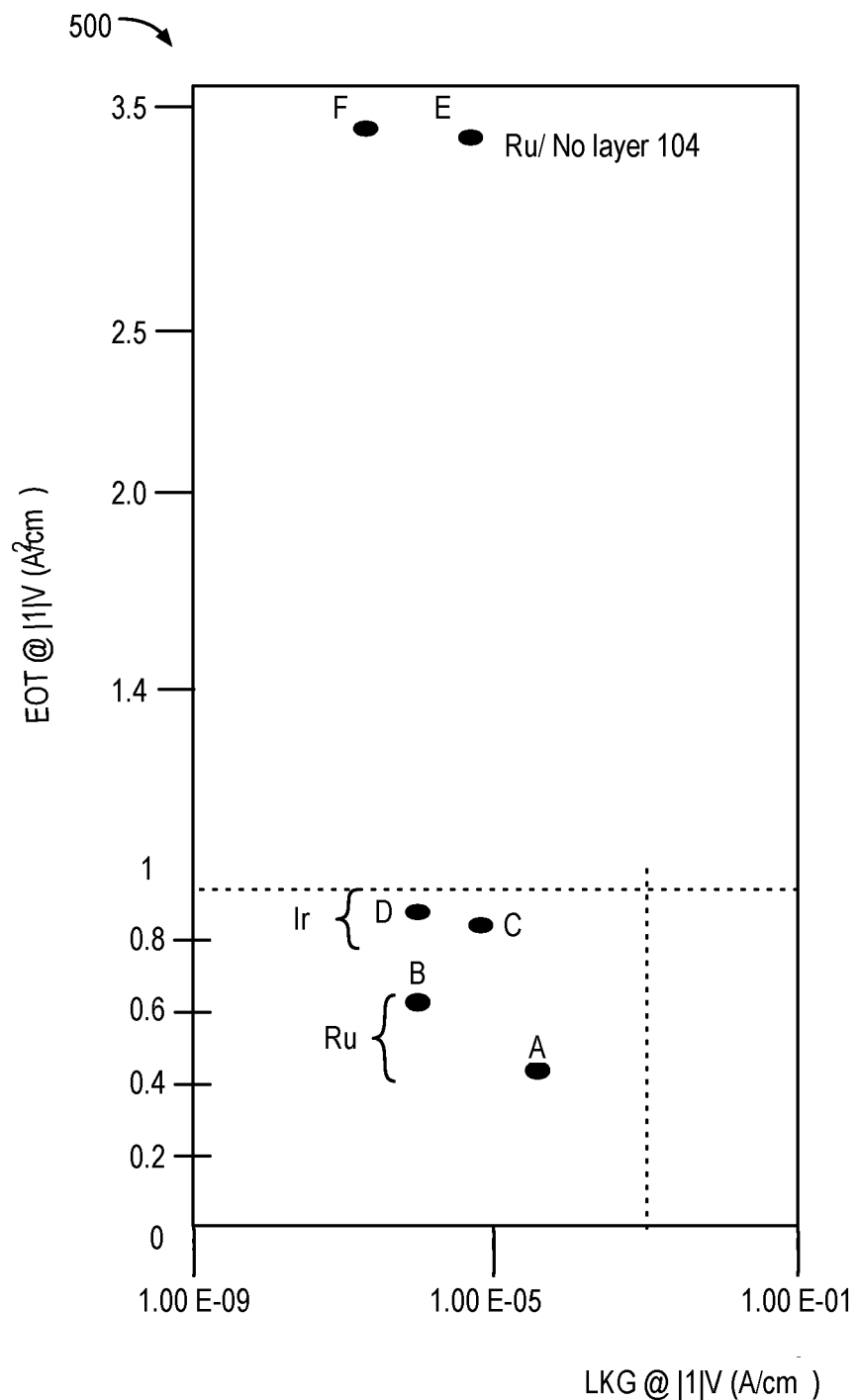
FIG. 5 illustrates a plot of electrical oxide thickness versus leakage current density for a plurality of MIM capacitors, in accordance with an embodiment of the present disclosure.

FIG. 5 is a plot 500 of an equivalent oxide thickness versus leakage current density for a variety of MIM capacitors. In the illustrative embodiment, the MIM capacitor has lateral dimensions that are 50 microns by 50 microns.

An equivalent oxide thickness (EOT) is a measure of how thick a silicon oxide film would need to be to produce the same effect as an insulator material used in its place. The insulator material has a dielectric constant substantially greater than a dielectric constant of the silicon oxide film. EOT is given by the following formula, $$EOT = t_{high-k}\left(\frac{K_{SiO_2}}{k_{high-k}}\right), \quad (1)$$

Where "$t_{high-k}$" is a thickness of a dielectric material having a high dielectric constant (k), $k_{SiO_2}$ is a dielectric constant of Silicon dioxide, $k_{high-k}$ is a dielectric constant of the dielectric material having a high dielectric constant.

The data points A and B in the plot 500 are representative of a MIM capacitor such as MIM capacitor 100A, described in FIG. 1A, where the seed layer 102 includes tantalum, electrode 104 includes ruthenium and the insulator layer 108 includes SrTiO₃. Referring again to FIG. 5, the measured leakage current density (horizontal axis) is less than $10^{-4}$ A/cm² and the equivalent oxide thickness (vertical axis) is approximately 0.4 nm for data point A. The value of dielectric constant is computed to be approximately 100. The measured leakage current density (horizontal axis) for data point B is less than $10^{-6}$ A/cm² and the equivalent oxide thickness (vertical axis) is approximately 0.6 nm. Data points A and B are obtained at different voltage bias conditions for MIM capacitor 100A. Data point A corresponds to measurement at minus IV and data point B corresponds to measurement at plus 1V, where the voltage bias conditions are with respect to ground.

The data points C and D in the plot 500 are representative of a MIM capacitor such as MIM capacitor 100A, described in FIG. 1A, where the seed layer 102 includes tantalum, electrode 104 includes iridium and the insulator layer 108 includes SrTiO₃. Referring again to FIG. 5, the measured leakage current density (horizontal axis) is less than $10^{-4}$ A/cm² and the equivalent oxide thickness (vertical axis) is approximately 0.885 nm for data point C. The measured leakage current density (horizontal axis) for data point B is less than $10^{-6}$ A/cm² and the equivalent oxide thickness (vertical axis) is approximately 0.98 nm. Data points C and are obtained at different voltage bias conditions for MIM capacitor 100A. Data point C corresponds to measurement at minus 1V and data point D corresponds to measurement at plus 1V, where the voltage bias conditions are with respect to ground.

In contrast, in an absence of a tantalum seed layer 102 from MIM capacitor 100A, can cause the electrical oxide thickness to be over 5 times higher even when the electrode 104 includes Ru. Data points E and D represent datapoints for +/−1V measurement of a MIM capacitor 100A including a Ru electrode 104, but no seed layer 102. The electrical oxide thickness is between 3.3 and 3.4 nm.

Figure 6A:
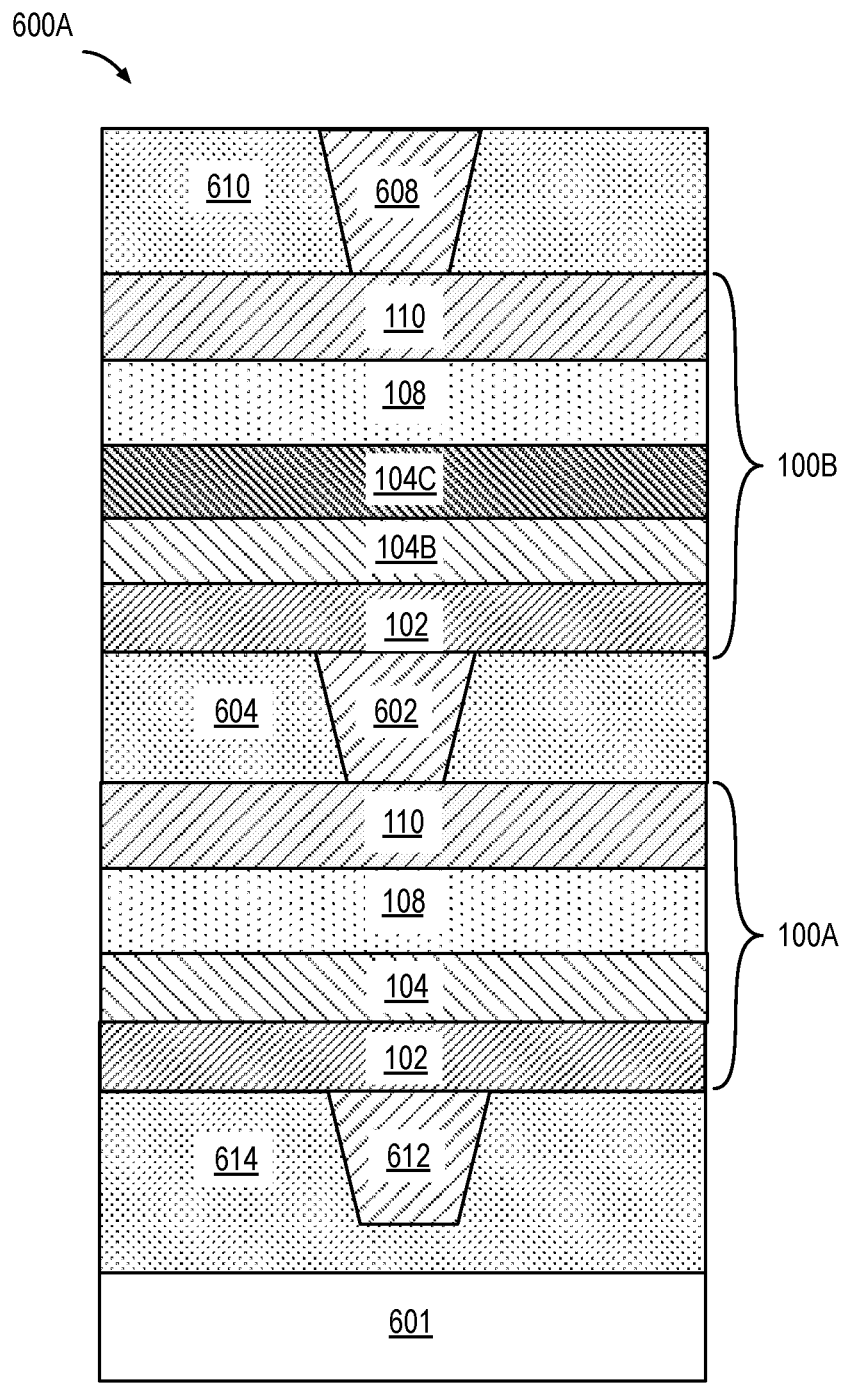
FIG. 6A illustrates a cross-sectional view of a pair of MIM capacitors, where each capacitor includes a Perovskite dielectric material and a crystallization layer, in accordance with an embodiment of the present disclosure.

FIG. 6 is a cross sectional illustration of a stacked capacitor structure 600A above a substrate 601 in accordance with an embodiment of the present disclosure. In an embodiment, the MIM capacitor structure 600A includes MIM capacitor 100A connected in series with a MIM capacitor 100B, by an interconnect 602. In the illustrative embodiment, the MIM capacitor 100B is stacked above MIM capacitor 100A. The MIM capacitors 100A and 100B are described above in association with FIG. 1A and FIG. 1B, respectively. Referring again to FIG. 6, the MIM capacitors 100A and 100B are vertically (along the Y-axis, as shown) separated by a dielectric 604. As shown, the interconnect 602 is adjacent to the dielectric 604. The interconnect 602 is on and coupled with MIM capacitor 100A and directly below and coupled with MIM capacitor 100B.

Depending on embodiments, the seed layer 102, insulator layer 108 electrode 110 in MIM capacitors 100A and 100B may include a same or a different material. In embodiments, the seed layer 102, insulator layer 108 electrode 110 in MIM capacitors have a same or substantially the same thickness. In some embodiments, electrode 104 includes a material that is the same or substantially the same as the material of the electrode layer 104B or 104C.

The stacked capacitor structure 600A further includes a second interconnect 608 above the electrode 110, as shown. The interconnect 608 is adjacent to a dielectric 610 that is directly on the electrode 110 of MIM capacitor 100B.

In the illustrative embodiment, the stacked capacitor structure 600A further includes a second interconnect 612 below the seed layer 102 of MIM capacitor 100A. The interconnect 612 is adjacent to a dielectric 614 that is directly adjacent to the electrode 110 of MIM capacitor 100A.

In an embodiment, substrate 601 is the same or substantially the same as the substrate 112 described above.

In an embodiment, each dielectric 604, dielectric 610 and dielectric 614 includes a same material. In an embodiment, each dielectric 604, dielectric 610 and dielectric 614 includes a material such as but not limited to silicon dioxide, silicon nitride, silicon carbide, or carbon doped silicon oxide. In one embodiment, each of the dielectric 604, dielectric 610 and dielectric 614 includes a material that is different from one another. In another embodiment, any two of the dielectrics 604, dielectric 610 or dielectric 614 includes a same or substantially the same material.

In an embodiment, the interconnect 602, 608 and 612 each include a liner layer and conductive cap. In an embodiment, the liner layer incudes Ti, Ta, TaN, Ru or Al and a conductive cap on the liner layer. The conductive cap may include a material such as W, Co, Ni or Cu.

Figure 6B:
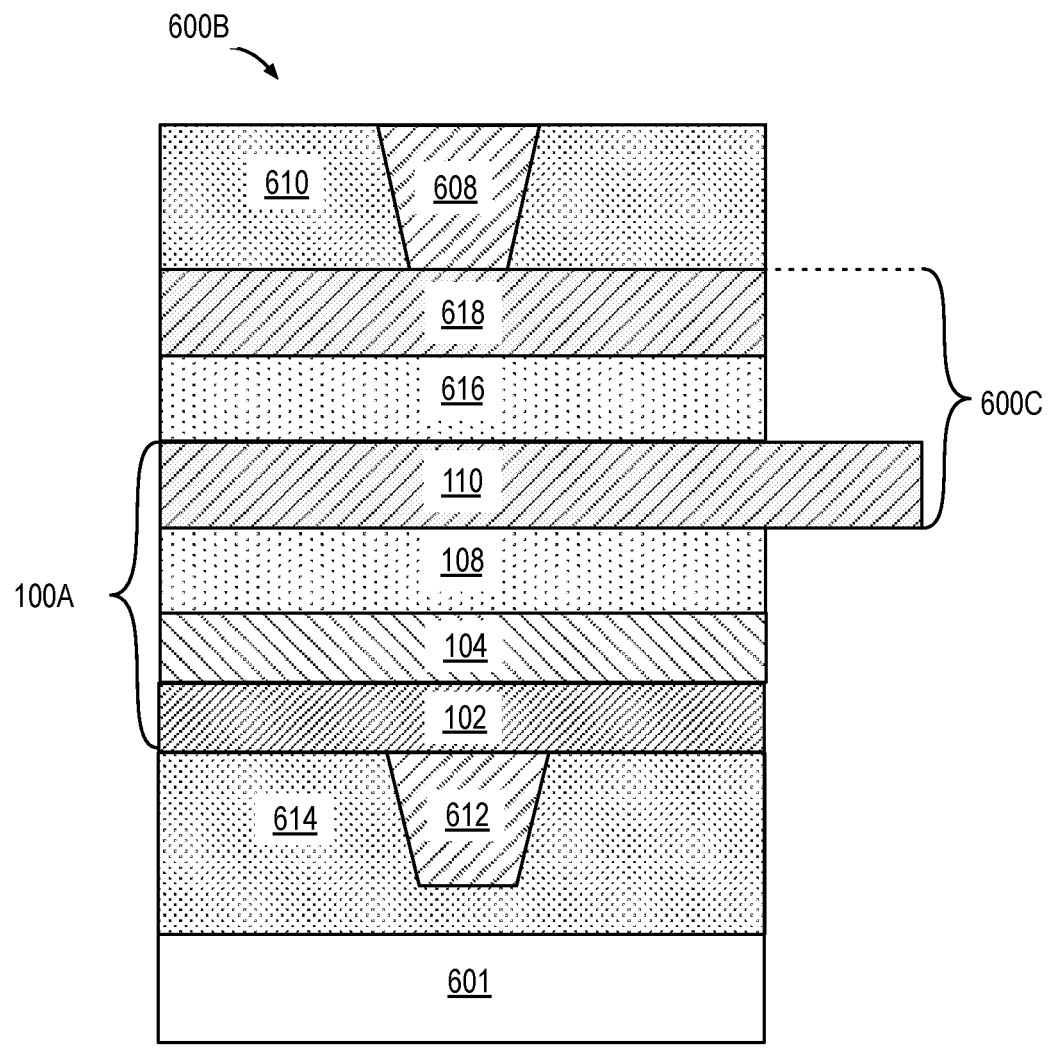
FIG. 6B illustrates a cross-sectional view of a pair of MIM capacitors, where each capacitor includes a Perovskite dielectric material, a crystallization layer, and a shared electrode, in accordance with an embodiment of the present disclosure.

In some embodiments, when electrode 110 includes ruthenium or iridium, an insulator layer in capacitor 100B can be directly on the electrode 110 of capacitor 100A, such as is shown in FIG. 6B. In the illustrative embodiment, capacitor structure 600B includes a capacitor 600C above and coupled with capacitor 100A. As shown, electrode 110 is shared between capacitors 100A and 600C. In the illustrative embodiment, capacitor 600C includes electrode 110, an insulator layer 616 on electrode 110, and a top electrode 618 on the insulator layer 616. In embodiments, insulator layer 616 includes a material that is the same or substantially the same as the material of the insulator layer 108. In embodiments, electrode 618 includes a material that is the same or substantially the same as the material of the electrode 110.

As shown, electrode 610 may extend laterally to couple with an interconnect (not shown) such as interconnect 612 or 608.

Figure 7A:
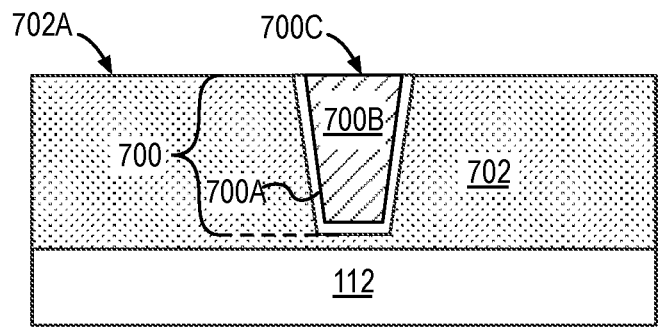
FIG. 7A illustrates a first interconnect layer formed above a substrate.

FIG. 7A illustrates a conductive interconnect 700 formed above a substrate 112. In some embodiments, the conductive interconnect 700 is formed in a dielectric layer 702, above a substrate 112, such as is shown. In an embodiment, the conductive interconnect 700 includes a barrier layer 700A and a fill metal 700B. In some examples, the barrier layer 700A includes a material such as tantalum, tantalum nitride or ruthenium. In some examples, the fill metal 700B includes a material such as cobalt, copper or tungsten. In other examples, the conductive interconnect 700 is fabricated using a subtractive etch process when materials other than copper are utilized. In an embodiment, the dielectric layer 702 includes a material such as but not limited to silicon dioxide, silicon nitride, silicon carbide, or carbon doped silicon oxide. The dielectric layer 702 may have an uppermost surface 702A that is substantially co-planar with an uppermost surface 700C of the conductive interconnect 700, as is illustrated. In some embodiments, conductive interconnect 700 is electrically connected to a separate circuit element such as a transistor (not shown). In an embodiment, the conductive interconnect 700 has a lateral dimension that is between 50 nm and 1 micron.

Figure 7B:
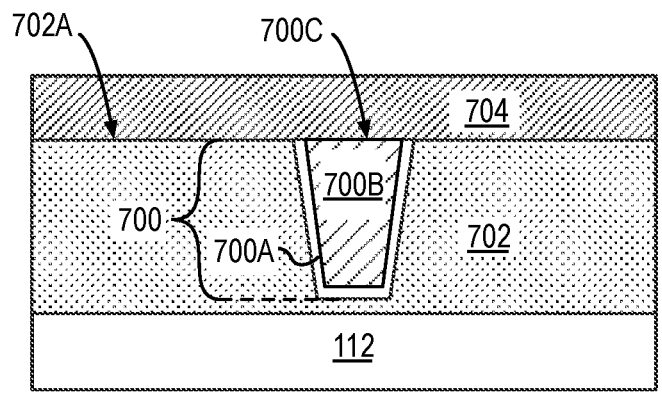
FIG. 7B illustrates the structure of FIG. 7A following the formation of a first layer of a material layer stack on the first interconnect layer, where the first layer includes a crystallization seed material, in accordance with an embodiment of the present disclosure.

FIG. 7B illustrates the structure of FIG. 7A following the formation of a first layer of a material layer stack for the formation of a MIM capacitor. In an embodiment, a seed layer 704 is deposited onto an uppermost dielectric surface 702A and uppermost conductive interconnect surface 700C. In an embodiment, the seed layer 704 includes tantalum and is blanket deposited. The blanket deposition may be performed by a physical vapor deposition process. As deposited the tantalum seed layer 704 may be BCC crystallized or amorphous. The seed layer 704 may be deposited to a thickness of 1 nm to 10 nm. The seed layer 704 is continuous over the surface of the dielectric 702 and over the surface of the conductive interconnect 700.

Figure 7C:
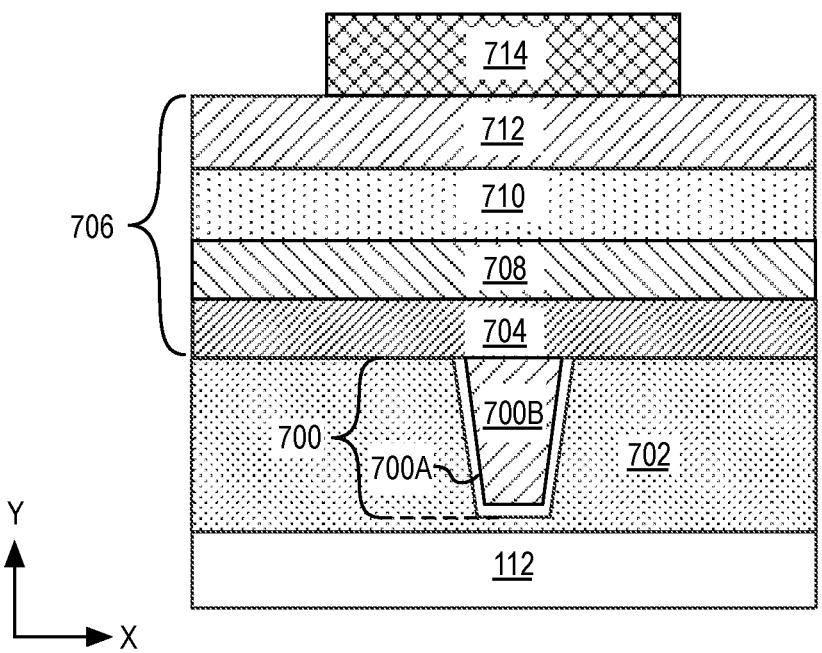
FIG. 7C illustrates the structure of FIG. 7B following the remaining layers of the material layer stack, including formation of a first electrode layer on the crystallization seed layer, a layer including a perovskite material on the first electrode layer and a second electrode layer on the layer including a perovskite dielectric material.

FIG. 7C illustrates the structure of FIG. 7B following the formation of the remaining layers in material layer stack 706 utilized in the formation of a MIM capacitor. In the illustrative embodiment, an electrode layer 708 is blanket deposited on the seed layer 704. In an exemplary embodiment, the electrode layer 708 is formed with a hexagonal crystal structure on the crystal template provided by the tantalum seed layer 704. In an embodiment, the electrode layer 708 includes ruthenium or iridium. While tantalum is not hexagonal, a BCC or amorphous tantalum facilitates Ru to crystallize in HCP structure. In an embodiment, crystallizing Ru with a HCP structure enables formation of an electrode layer 708 having an uppermost surface that has an RMS surface roughness that is less than or equal to 1.2 nm.

Though not shown, in an embodiment, depositing the electrode layer includes depositing a stack of electrode layers where the first layer in the stack of electrode layers is ruthenium and the second layer, above the first layer, is iridium.

The deposition process is continued with the formation of an insulator layer 710. In an embodiment, the insulator layer 710 includes a material that is the same or substantially the same as the material of the insulator layer 108 described above in association with FIG. 1A. Referring again to FIG. 7C, in an embodiment, the insulator layer 710 is deposited at a temperature of 400 degrees Celsius. A temperature of 400 degrees is sufficiently high to crystallize the insulator layer 710 without adversely affecting the underlying seed layer 704 or the electrode layer 708. As discussed above, the insulator layer 710 has a polycrystalline structure as deposited. Such as polycrystalline structure is indicative of lattice matching with an underlying electrode layer 708 in embodiments where the electrode layer 708 has a hexagonal crystal structure, such as for example an iridium electrode layer. In an embodiment, the insulator layer 108 is blanket deposited in-situ post deposition of the electrode layer 708. The insulator layer 108 is deposited to a thickness of 5 nm-50 nm.

An electrode layer 712 is deposited on the insulator layer 710. The electrode layer may include ruthenium, iridium or tantalum. The electrode layer 712 may be deposited by a physical vapor deposition (PVD) process or a plasma enhanced chemical vapor deposition (PECVD). In embodiments, the electrode layer 712 may be deposited to a thickness of 10 nm-100 nm.

A mask 714 is formed on the electrode layer 712. In an embodiment, the mask 714 defines a shape and size of a MIM capacitor and a location where the capacitor is to be subsequently formed with respect the interconnect 700. In some embodiments, the mask 714 is formed by a lithographic process. In other embodiments, the mask 714 includes a dielectric material that has been patterned.

Figure 7D:
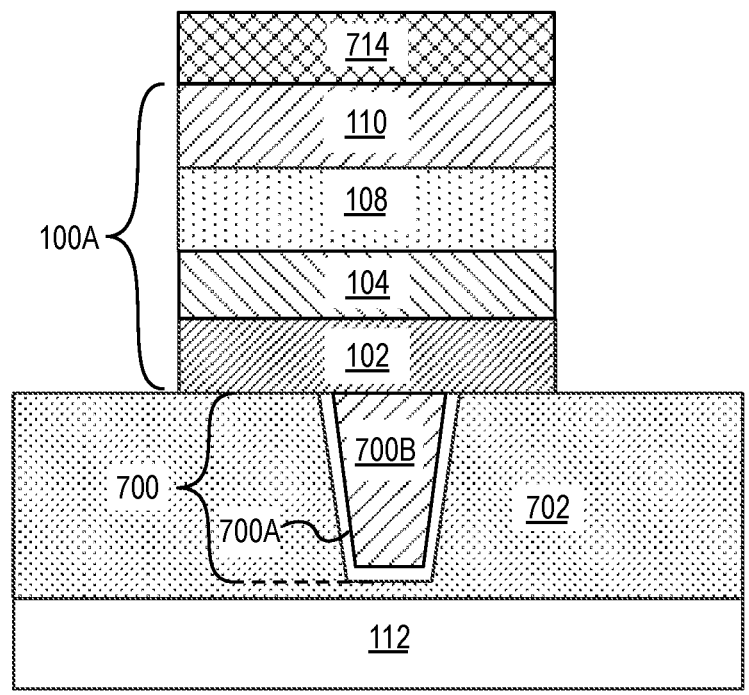
FIG. 7D illustrates the structure of FIG. 7C following patterning of the material layer stack to form a MIM capacitor structure.

FIG. 7D illustrates a cross-sectional view of the structure in FIG. 7C following the patterning of the material layer stack 706 to form a MIM capacitor 100A. In an embodiment, a plasma etch process is utilized to pattern the material layer stack 706 to form MIM capacitor 100A. The plasma etch process etches the various layers in the material layer stack 706 to form electrode 110, insulator layer 108, electrode 104 and seed layer 102, selectively to the mask 714. In an embodiment, the mask is removed after the plasma etch process.

Figure 7E:
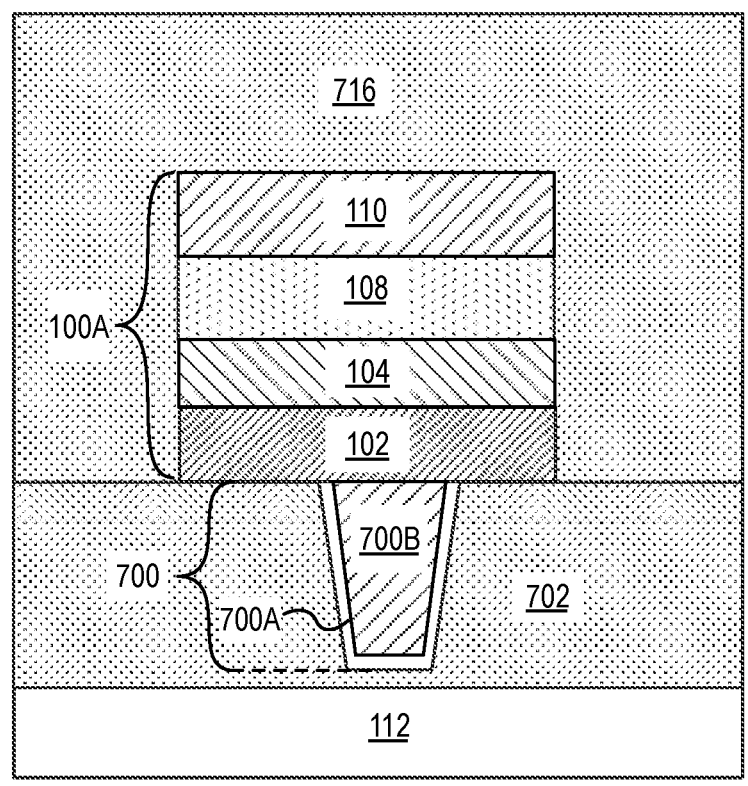
FIG. 7E illustrates the structure of FIG. 7D following the formation of a dielectric material on the MIM capacitor structure.

FIG. 7E illustrates a cross-sectional view of the structure in FIG. 7D following the process of depositing a dielectric 716 on the MIM capacitor 100A. In the illustrative embodiment, the dielectric 716 includes a material such as but not limited to silicon dioxide, silicon nitride, silicon carbide, or carbon doped silicon oxide. In an embodiment, after forming the dielectric 716 a planarization is performed. A chemical mechanical polish (CMP) process may be used to planarize the dielectric 716.

Figure 7F:
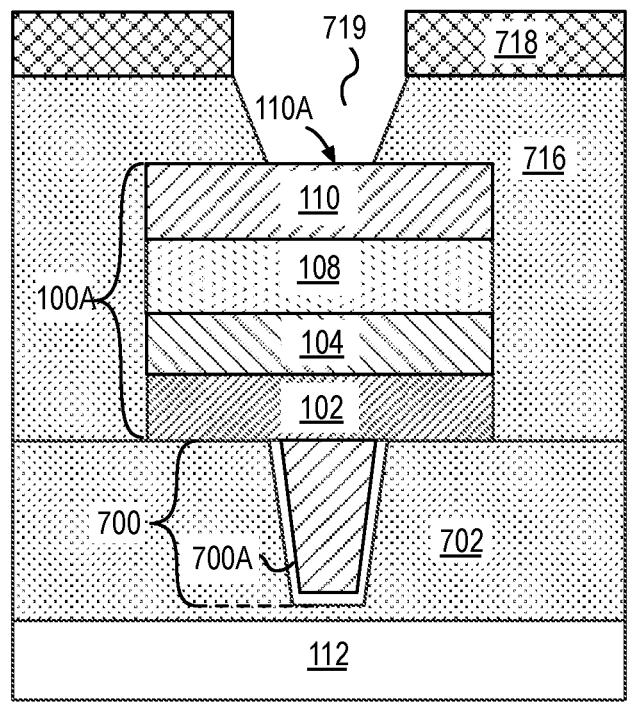
FIG. 7F illustrates the structure of FIG. 7E following the formation of a mask on the dielectric material followed by the formation of an opening in the dielectric material.

FIG. 7F illustrates a cross-sectional view of the structure in FIG. 7E following the process to form an opening in the dielectric above the MIM capacitor 100A. In the illustrative embodiment, a mask 718 is formed on the dielectric 716. The mask defines a location where an opening is to be formed relative to the MIM capacitor 100A.

An opening 719 is formed in the dielectric 716 after formation of the mask 718. In an embodiment, a plasma etch process is used to form the opening 719. The plasma etch process exposes an uppermost surface 110A of the electrode 110.

Figure 7G:
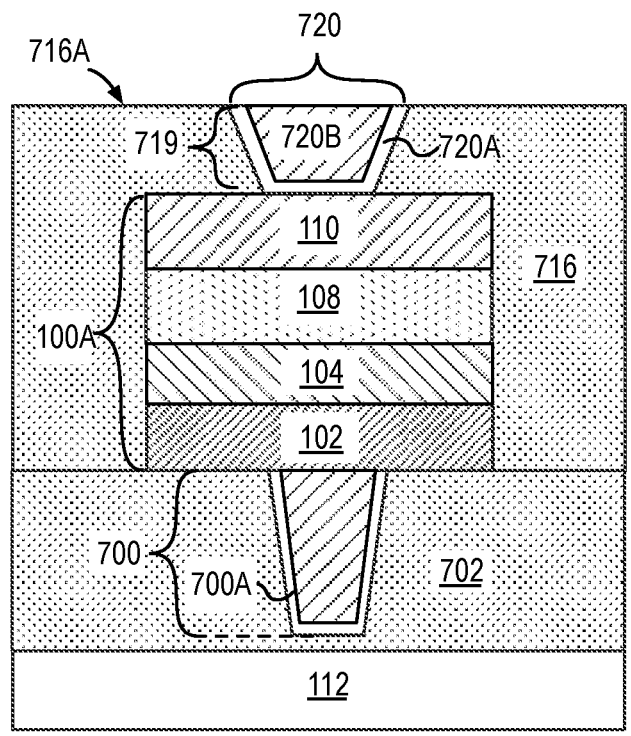
FIG. 7G illustrates the structure of FIG. 7F following the formation of via electrodes in the opening in the dielectric material.

FIG. 7G illustrates a cross-sectional view of the structure in FIG. 7F following the process to form an interconnect 720 on the electrode 110. In an embodiment, an adhesion layer 720A is formed in the opening 719, on the electrode 110 and on sidewalls of dielectric 716 and on an uppermost surface 716A of the dielectric 716. The adhesion layer 720A may include a material such as tantalum, tantalum nitride or ruthenium. A fill metal 720B is deposited on the adhesion layer 720A. In some examples, the fill metal 720B includes a material such as cobalt, copper or tungsten.

After the adhesion layer 720A and fill metal 720B are deposited, a planarization process may be utilized to remove the excess adhesion layer 720A and fill metal 720B from above the uppermost surface 716A. The planarization process forms an interconnect 720.

Figure 8:
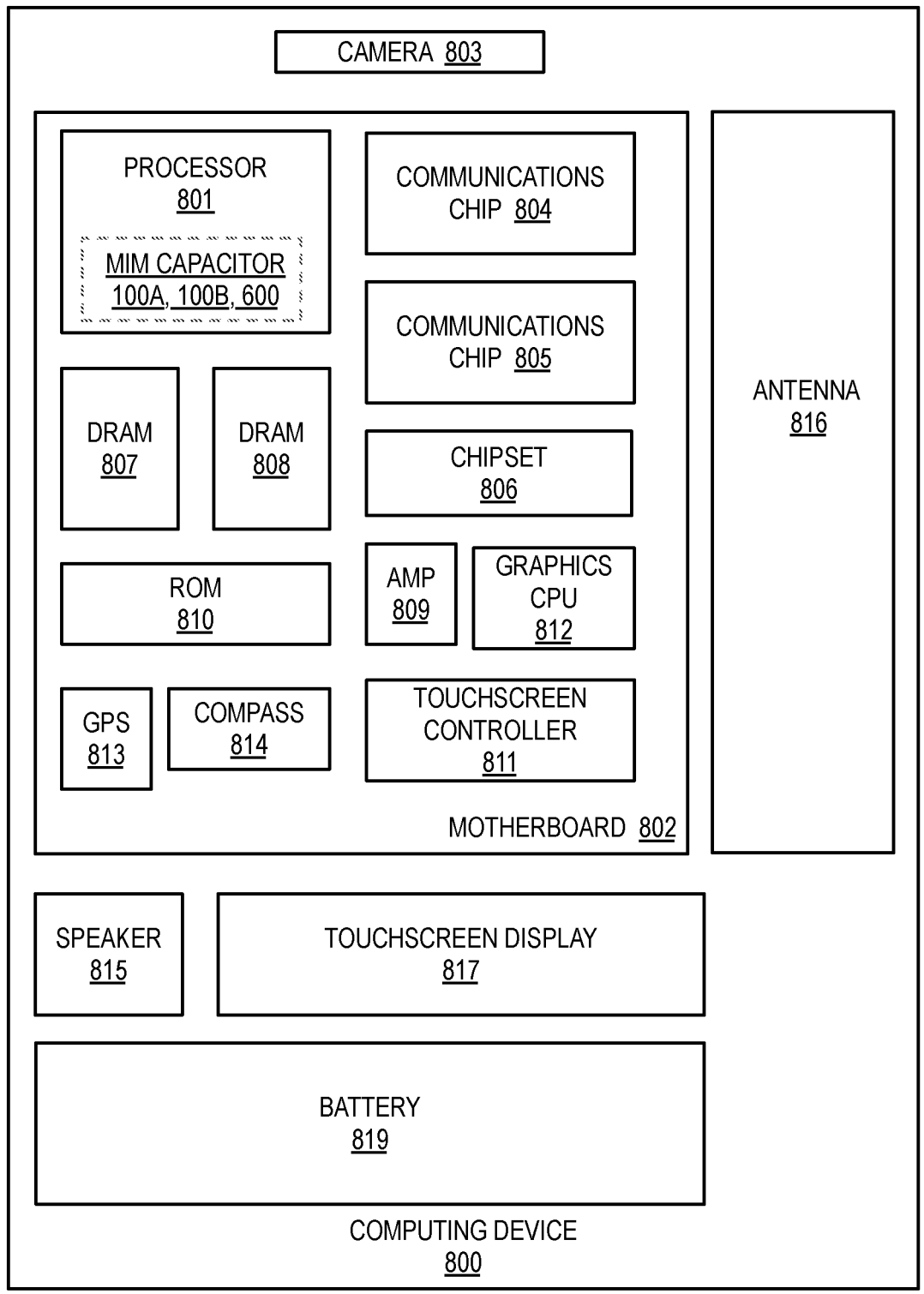
FIG. 8 illustrates a cross-sectional view of a MIM capacitor including a seed layer coupled to a transistor.

FIG. 8 illustrates a computing device 800 in accordance with embodiments of the present disclosure. As shown, computing device 800 houses a motherboard 802. Motherboard 802 may include a number of components, including but not limited to a processor 801 and at least one communications chip 804 or 805. Processor 801 is physically and electrically coupled to the motherboard 802. In some implementations, communications chip 805 is also physically and electrically coupled to motherboard 802. In further implementations, communications chip 805 is part of processor 801.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset 806, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 805 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 805 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communications chips 804 and 805. For instance, a first communications chip 805 may be dedicated to shorter range wireless communications such as Wi-Fi and Bluetooth and a second communications chip 804 may be dedicated to longer range wireless communications such as GPS, EDGE, GPRS, CDMA, WiMAX, LTE, Ev-DO, and others.

Processor 801 of the computing device 800 includes an integrated circuit die packaged within processor 801. In some embodiments, the integrated circuit die of processor 801 includes one or more interconnect structures, non-volatile memory devices, and transistors coupled with capacitors such as MIM capacitor 100A, 100B or 600 described in FIGS. 1A, 1B or 6, respectively. Referring again to FIG. 8, the term "processor" may refer to any device or portion of a device that processes electronic data from registers and/or memory to transform that electronic data into other electronic data that may be stored in registers and/or memory.

Communications chip 805 also includes an integrated circuit die packaged within communication chip 805. In another embodiment, the integrated circuit die of communications chips 804, 805 includes one or more interconnect structures, non-volatile memory devices, capacitors such as MIM capacitor 100A, 100B or 600 described above, and one or more transistors coupled with capacitors such as MIM capacitor 100A, 100B or 600 described above. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics CPU 812, flash memory, global positioning system (GPS) device 813, compass 814, a chipset 806, an antenna 816, a power amplifier 808, a touchscreen controller 811, a touchscreen display 817, a speaker 815, a camera 803, and a battery 819, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 800 and discussed above may contain a stand-alone integrated circuit memory die that includes one or more arrays of NVM devices.

In various implementations, the computing device 800 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
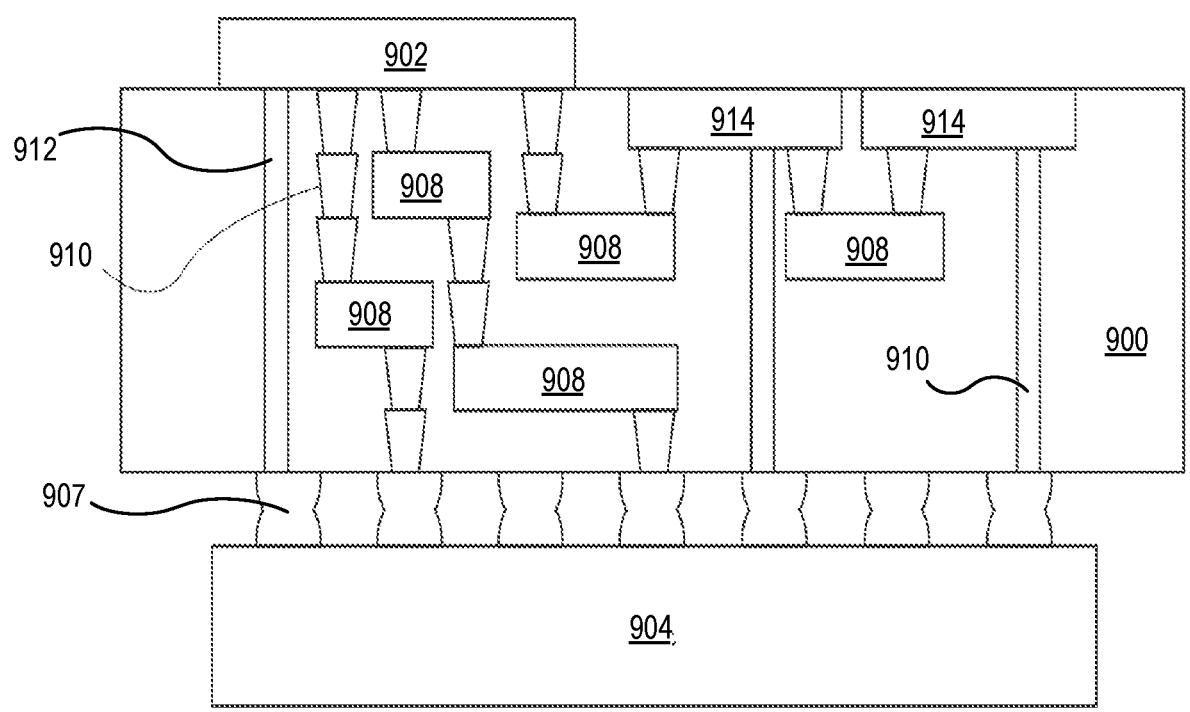
FIG. 9 illustrates a computing device in accordance with embodiments of the present disclosure.

FIG. 9 illustrates an integrated circuit (IC) structure 900 that includes one or more embodiments of the disclosure. The integrated circuit (IC) structure 900 is an intervening substrate used to bridge a first substrate 902 to a second substrate 904. The first substrate 902 may be, for instance, an integrated circuit die. The second substrate 904 may be, for instance, a memory module, a computer mother, or another integrated circuit die. Generally, the purpose of an integrated circuit (IC) structure 900 is to spread a connection to a wider pitch or to reroute a connection to a different connection. For example, an integrated circuit (IC) structure 900 may couple an integrated circuit die to a ball grid array (BGA) 907 that can subsequently be coupled to the second substrate 904. In some embodiments, the first substrate 902 and the second substrate 904 are attached to opposing sides of the integrated circuit (IC) structure 900. In other embodiments, the first substrate 902 and the second substrate 904 are attached to the same side of the integrated circuit (IC) structure 900. And in further embodiments, three or more substrates are interconnected by way of the integrated circuit (IC) structure 900.

The integrated circuit (IC) structure 900 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 908 and vias 910, including but not limited to through-silicon vias (TSVs) 912. The integrated circuit (IC) structure 900 may further include embedded devices 914, including both passive and active devices. Such embedded devices 914 include capacitors, decoupling capacitors such as capacitors 100A, 100B, 600 as described above, resistors, inductors, fuses, diodes, transformers, device structure including transistors, such as one or more transistors coupled with capacitors 100A, 100B, 600 as described above. Referring again to FIG. 9, the integrated circuit (IC) structure 900 may further include embedded devices 914 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 900.

Figure 10:
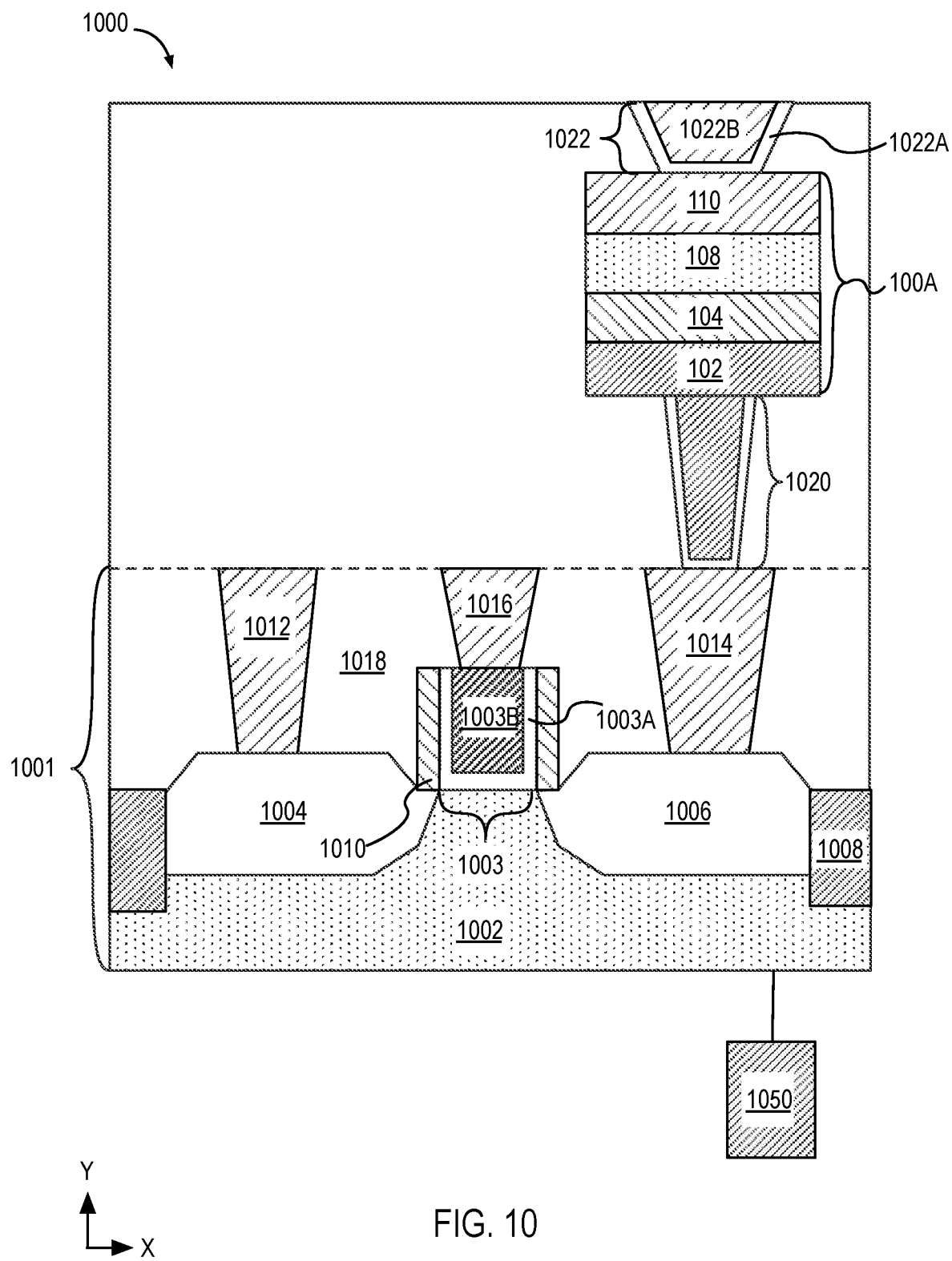
FIG. 10 illustrates an integrated circuit (IC) structure that includes one or more embodiments of the present disclosure.

FIG. 10 illustrates a system 1000 which includes a capacitor such as capacitor 100A, 100B or 600 described in association with FIGS. 1A, 1B or 6, respectively, coupled to an access transistor 1001. Referring again to FIG. 10, in an embodiment, the transistor 1001 is on a substrate 1002 and has a gate 1003, a source region 1004, and a drain region 1006. In the illustrative embodiment, an isolation 1008 is adjacent to the source region 1004, drain region 1006 and portions of the substrate 1002. In some implementations of the disclosure, such as is shown, a pair of sidewall spacers 1010 are on opposing sides of the gate 1003.

The transistor 1001 further includes a source contact 1012 above and electrically coupled to the source region 1004, drain contact 1014 above and electrically coupled to the drain region 1006 and a gate contact 1016 above and electrically coupled to the gate 1003, as is illustrated in FIG. 10. The transistor 1001 also includes dielectric 1018 adjacent to the gate 1003, source region 1004, drain region 1006, isolation 1008, sidewall spacers 1010, source contact 1012, drain contact 1014 and gate contact 1016.

In an embodiment, the system 1000 further includes a battery and antenna 1050 coupled to the transistor 1001.

In the illustrative embodiment, the integrated circuit capacitor structure 100A includes a seed layer 102, where the seed layer 102 includes a crystalline tantalum and an electrode 104 on the seed layer 102, where the electrode 104 includes at least one of ruthenium or iridium. The seed layer 102 and the electrode 104 may be collectively referred to an electrode structure 106. In an embodiment, the tantalum seed layer 102 has an amorphous structure. A tantalum seed layer 102 is advantageously chosen for its high melting point, such as greater than 1500 degrees C. A further advantage includes ease of patterning a seed layer 102 including tantalum compared to other refractory metals, such as titanium or tungsten, that have similar melting points. The MIM capacitor 100A includes an insulator layer 108 on the seed layer 102, where the insulator layer 108 includes oxygen and one or more of Sr, Ba or Ti. The MIM capacitor 100A further includes an electrode 110 on the insulator layer 108, where the electrode 110 includes a metal or a metal alloy.

The electrode 1020 is further coupled with the transistor 1001 through the conductive interconnect 1020. As shown the conductive interconnect 1020 is on and coupled with the drain contact 1014 of the transistor 1001. In other embodiments, one or more layers of interconnects exist between conductive interconnect 1020 and the drain contact 1014. The MIM capacitor 100A is also electrically coupled with a conductive interconnect 1022. The conductive interconnect 1022 includes a liner layer 1022A and a fill metal 1022B. In embodiments, the liner layer 1022A and fill metal include materials that are the same or substantially the same as the material of the liner layer 700A and fill metal 702B described is association with FIG. 7A.

In an embodiment, the underlying substrate 1002 represents a surface used to manufacture integrated circuits. Suitable substrate 1002 includes a material such as single crystal silicon, polycrystalline silicon and silicon on insulator (SOI), as well as substrates formed of other semiconductor materials. In some embodiments, the substrate 1002 may also include semiconductor materials, metals, dielectrics, dopants, and other materials commonly found in semiconductor substrates.

In an embodiment, the transistor 1001 associated with substrate 1002 are metal-oxide-semiconductor field-effect transistors (MOSFET or simply MOS transistors), fabricated on the substrate 1002. In some embodiments, the transistor 1001 is an access transistor 1001. In various implementations of the disclosure, the transistor 1001 may be planar transistors, nonplanar transistors, or a combination of both.

Nonplanar transistors include FinFET transistors such as double-gate transistors and tri-gate transistors.

In some embodiments, gate 1003 includes at least two layers, a gate dielectric layer 1003A and a gate electrode 1003B. The gate dielectric layer 1003A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1003A to improve its quality when a high-k material is used.

The gate electrode 1003B of the access transistor 1001 of substrate 1002 is formed on the gate dielectric layer 1003A and may consist of at least one P-type work function metal or N-type work function metal, depending on whether the transistor is to be a PMOS or an NMOS transistor. In some implementations, the gate electrode 1003B may consist of a stack of two or more metal layers, where one or more metal layers are work function metal layers and at least one metal layer is a conductive fill layer.

For a PMOS transistor, metals that may be used for the gate electrode 1003B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1003B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 1003B may consist of one or more U-shaped metal layers formed atop one or more planar, non-U-shaped layers.

The sidewall spacers 1010 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 1004 and drain region 1006 are formed within the substrate adjacent to the gate stack of each MOS transistor. The source region 1004 and drain region 1006 are generally formed using either an implantation/diffusion process or an etching/deposition process. In the former process, dopants such as boron, aluminum, antimony, phosphorous, or arsenic may be ion-implanted into the substrate to form the source region 1004 and drain region 1006. An annealing process that activates the dopants and causes them to diffuse further into the substrate typically follows the ion implantation process. In the latter process, the substrate 1002 may first be etched to form recesses at the locations of the source and drain regions. An epitaxial deposition process may then be carried out to fill the recesses with material that is used to fabricate the source region 1004 and drain region 1006. In some implementations, the source region 1004 and drain region 1006 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1004 and drain region 1006 may be formed using one or more alternate semiconductor materials such as germanium or a group III-V material or alloy. And in further embodiments, one or more layers of metal and/or metal alloys may be used to form the source region 1004 and drain region 1006.

In an embodiment, the source contact 1012, the drain contact 1014 and gate contact 1016 each include a multi-layer stack. In an embodiment, the multi-layer stack includes one or more of Ti, Ru or Al and a conductive cap on the one or more of Ti, Ta, Ru or Al. The conductive cap may include a material such as W or Cu.

In an embodiment, the interconnect 1020 includes a liner layer and a fill metal on the liner layer, as shown. In an embodiment, the liner layer includes one or more of Ti, Ta, Ru or Al. The fill metal may include a material such as W or Cu.

The isolation 1008 and dielectric 1018 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Thus, one or more embodiments of the present disclosure relate to capacitor devices such as capacitors 100A, 100B and 600 as described above. The capacitors 100A, 100B or 600 may be used in various integrated circuit applications.

In a first example, a metal insulator metal (MIM) capacitor includes a seed layer including tantalum, a first electrode on the seed layer, where the first electrode includes at least one of ruthenium or iridium and an insulator layer on the seed layer, where the insulator layer includes oxygen and one or more of Sr, Ba or Ti. The capacitor device further includes a second electrode layer on the insulator layer, where the second electrode layer includes a second metal or a second metal alloy.

In second examples, for any of first examples, the seed layer has a thickness between 1 nm and 10 nm.

In third examples, for any of the first through second examples, the insulator layer includes oxygen, Sr and Ti.

In fourth examples, for any of the first through third examples, the insulator layer includes oxygen, Ba and Ti.

In fifth examples, for any of the first through fourth examples, the insulator layer includes oxygen, Sr, Ba and Ti, the insulator layer has a chemical composition, $Ba_xSr_{1-x}TiO_3$ and X is less than 95 and greater than 5.

In sixth examples, for any of the first through fifth examples, the insulator layer has a thickness between 5 nm and 50 nm.

In seventh examples, for any of the first through sixth examples, the first electrode includes ruthenium.

In eighth examples, for any of the first through seventh examples, the first electrode includes iridium.

In ninth examples, for any of the first through eight examples the first electrode is a first electrode structure and where the first electrode structure includes a first electrode layer including one of iridium or ruthenium and a second electrode layer on the first electrode layer, the second electrode layer including the other of ruthenium or iridium.

In tenth examples, for any of the ninth examples, the first electrode is a first electrode structure, and where the first electrode structure includes a first electrode layer including ruthenium and a second electrode layer including iridium on the first electrode layer.

In eleventh examples, for any of the ninth through tenth examples, the first electrode layer has a thickness between 2.5 nm-20 nm, and the second electrode layer has a thickness between 2.5 nm-20 nm, wherein the total combined thickness of the first electrode layer and the second electrode layer is between 5 nm and 40 nm.

In twelfth examples, for any of the ninth through eleventh examples, the first electrode includes ruthenium and has a root mean square thickness variation of an uppermost surface that is between 0.3 nm and 1.5 nm.

In thirteenth examples, for any of the ninth through twelfth examples, a stacked metal insulator metal (MIM) capacitor structure includes a first capacitor including a first seed layer including tantalum. The first capacitor further includes a first electrode on the seed layer, where the first electrode includes at least one of ruthenium or iridium. A first insulator layer including oxygen is on the first electrode, where the first insulator layer includes one or more of Sr, Ba or Ti. The first capacitor further includes a second electrode on the insulator layer. The stacked MIM capacitor further includes a second capacitor above and coupled with the first capacitor, where the second capacitor includes a second seed layer including tantalum, a third electrode structure on the second seed layer, where the third electrode structure has a layer of iridium; and a layer of ruthenium on the layer of iridium. The second capacitor further includes a second insulator layer including oxygen on the third electrode structure, the second insulator layer including one or more of Sr, Ba or Ti. The second capacitor further includes a fourth electrode on the second insulator layer. The stacked MIM capacitor structure further includes an interconnect structure between and in contact with each of the second seed layer and the second electrode.

In a fourteenth example, for any of the ninth through thirteenth examples, at least one of the first seed layer or the second seed layer includes a thickness between 1 nm and 10 nm.

In fifteenth examples, for any of the ninth through fourteenth examples, at least one of the first insulator layer or the second insulator layer includes oxygen, Sr and Ti.

In sixteenth examples, for any of the ninth through fifteenth examples, at least one of the first insulator layer or the second insulator layer includes oxygen, Ba and Ti.

In seventeenth examples, for any of the ninth through sixteenth examples, at least one of the first insulator layer or the second insulator layer includes oxygen, Sr, Ba and Ti, wherein at least one of the first insulator layer or the second insulator layer has a chemical composition, $Ba_xSr_{1-x}TiO_3$ wherein X is less than 95 and greater than 5, and wherein at least one of the first insulator layer or the second insulator layer has a thickness between 5 nm and 50 nm.

In eighteenth examples, for any of the ninth through seventeenth examples, the first electrode includes ruthenium or iridium.

In nineteenth examples, a method to fabricate a metal insulator metal (MIM) capacitor includes forming a material layer stack. The forming of the material layer stack includes depositing a seed layer including tantalum above a substrate, depositing a first electrode material layer on the seed layer, the first electrode material layer including at least one of ruthenium or iridium. The method further includes depositing an insulator layer including oxygen on the first electrode material layer, where the insulator layer includes one or more of Sr, Ba or Ti. The method further includes depositing a second electrode material layer on the insulator layer and patterning the material layer stack into a block having sidewalls.

In twentieth example, for any of the nineteenth examples, the method further includes annealing the material layer stack to a temperature greater than or equal to 400 degrees Celsius.

In twenty first examples, a system includes a processor, a radio transceiver coupled to the processor, where the transceiver includes a transistor. The transistor includes a drain contact coupled to a drain, a source contact coupled to a source and a gate contact coupled to a gate. A metal insulator metal (MIM) capacitor is coupled to a source or a drain of the transistor. The metal insulator metal (MIM) capacitor includes a seed layer including tantalum, a first electrode on the seed layer, where the first electrode includes at least one of ruthenium or iridium and an insulator layer on the seed layer, where the insulator layer includes oxygen and one or more of Sr, Ba or Ti. The capacitor device further includes a second electrode layer on the insulator layer, where the second electrode layer includes a second metal or a second metal alloy.

In twenty second examples, for any of the twenty first examples, system further includes a battery and an antenna coupled with the processor.

What is claimed is:

1. A metal insulator metal (MIM) capacitor comprising:
a tantalum layer;
a first electrode material on the tantalum layer, the first electrode material comprising at least one of ruthenium or iridium;
an insulator layer comprising oxygen over the first electrode material, the insulator layer comprising one or more of Sr, Ba or Ti; and
a second electrode material over the insulator layer.

2. The MIM capacitor of claim 1, wherein the tantalum layer has a thickness between 1 nm and 10 nm and wherein the tantalum layer is crystalline or amorphous.

3. The MIM capacitor of claim 1, wherein the insulator layer comprises oxygen, Sr and Ti.

4. The MIM capacitor of claim 1, wherein the insulator layer comprises oxygen, Ba and Ti.

5. The MIM capacitor of claim 1, wherein the insulator layer comprises oxygen, Sr, Ba and Ti, wherein the insulator layer has a chemical composition, $Ba_xSr_{1-x}TiO_3$ and wherein X is less than 95 and greater than 5.

6. The MIM capacitor of claim 1, wherein the insulator layer has a thickness between 5 nm and 50 nm.

7. The MIM capacitor of claim 1, wherein the first electrode material comprises ruthenium.

8. The MIM capacitor of claim 1, wherein the first electrode material comprises iridium.

9. The MIM capacitor of claim 1, wherein the first electrode material is in a first electrode structure and wherein the first electrode structure comprises a first electrode material layer comprising one of iridium or ruthenium and a second electrode material layer on the first electrode material layer, the second electrode material layer comprising the other of ruthenium or iridium.

10. The MIM capacitor of claim 1, wherein the first electrode material is in a first electrode structure, and wherein the first electrode structure comprises a first electrode material layer comprising ruthenium and a second electrode material layer comprising iridium on the first electrode material layer.

11. The MIM capacitor of claim 10, wherein the first electrode material layer has a thickness between 2.5 nm-20 nm, and the second electrode material layer has a thickness between 2.5 nm-20 nm, wherein the total combined thickness of the first electrode material layer and the second electrode material layer is between 5 nm and 50 nm.

12. The MIM capacitor of claim 1, wherein the first electrode material comprises ruthenium and has a root mean square thickness variation of an uppermost surface that is between 0.3 nm and 1.5 nm.

13. A stacked metal insulator metal (MIM) capacitor structure comprising:
a first capacitor comprising:
a first seed layer comprising tantalum;
a first electrode on the seed layer, the first electrode comprising at least one of ruthenium or iridium;
a first insulator layer comprising oxygen on the first electrode, the first insulator layer comprising one or more of Sr, Ba or Ti; and
a second electrode on the insulator layer;
second capacitor above and coupled with the first capacitor, the second capacitor comprising:
a second seed layer comprising tantalum;
a third electrode structure on the second seed layer, the third electrode structure comprising:
a layer of iridium; and
a layer of ruthenium on the layer of iridium;
a second insulator layer comprising oxygen on the third electrode structure, the second insulator layer comprising one or more of Sr, Ba or Ti; and
a fourth electrode on the second insulator layer; and
an interconnect structure between and in contact with each of the second seed layer and the second electrode.

14. The stacked MIM capacitor structure of claim 13, wherein at least one of the first seed layer or the second seed layer is Ta of a thickness between 1 nm and 10 nm.

15. The stacked MIM capacitor structure of claim 13, wherein at least one of the first insulator layer or the second insulator layer comprises oxygen, Sr and Ti.

16. The stacked MIM capacitor structure of claim 13, wherein at least one of the first insulator layer or the second insulator layer comprises oxygen, Ba and Ti.

17. The stacked MIM capacitor structure of claim 13, wherein at least one of the first insulator layer or the second insulator layer comprises oxygen, Sr, Ba and Ti, wherein at least one of the first insulator layer or the second insulator layer has a chemical composition, $Ba_xSr_{1-x}TiO_3$ wherein X is less than 95 and greater than 5, and wherein at least one of the first insulator layer or the second insulator layer has a thickness between 5 nm and 50 nm.

18. The stacked MIM capacitor structure of claim 13, wherein the first electrode comprises ruthenium or iridium.

19. A system comprising:
a processor;
a radio transceiver coupled to the processor, wherein the transceiver includes a transistor comprising:
a drain contact coupled to a drain;
a source contact coupled to a source; and
a gate contact coupled to a gate; and
a metal insulator metal (MIM) capacitor coupled to a source or a drain of the transistor, the MIM capacitor comprising:
a seed layer comprising tantalum;
a first electrode on the seed layer, the first electrode comprising at least one of ruthenium or iridium;
an insulator layer comprising oxygen on the first electrode, the insulator layer comprising one or more of Sr, Ba or Ti; and
a second electrode on the insulator layer.

20. The system of claim 19, further comprises a battery and an antenna coupled with the transistor.

* * * * *